US012782408B2

(12) United States Patent
Hartley et al.

(10) Patent No.: US 12,782,408 B2
(45) Date of Patent: Nov. 3, 2026

(54) DEVICE AND METHOD FOR ELECTROSTATIC DISCHARGE EVENT ALERT

(71) Applicant: Honeywell Federal Manufacturing & Technologies, LLC, Kansas City, MO (US)

(72) Inventors: Daniel Benjamin Hartley, Kansas City, MO (US); Logan Thomas Walz, Kansas City, MO (US)

(73) Assignee: Honeywell Federal Manufacturing & Technologies, LLC, Kansas City, MO (US)

( * ) Notice: Subject to any disclaimer, the term of this patent is extended or adjusted under 35 U.S.C. 154(b) by 0 days.

(21) Appl. No.: 18/979,956

(22) Filed: Dec. 13, 2024

(65) Prior Publication Data

US 2025/0199046 A1 Jun. 19, 2025

Related U.S. Application Data

(60) Provisional application No. 63/610,552, filed on Dec. 15, 2023.

(51) Int. Cl.
*G01R 31/00* (2006.01)
*G08B 7/06* (2006.01)

(52) U.S. Cl.
CPC ............ *G01R 31/001* (2013.01); *G08B 7/06* (2013.01)

(58) Field of Classification Search
None
See application file for complete search history.

(56) References Cited

U.S. PATENT DOCUMENTS

| | | | | |
|---|---|---|---|---|
| 5,903,220 A * | 5/1999 | Jon | .................... | G01R 31/002 340/649 |
| 2009/0167313 A1 * | 7/2009 | Kraz | .................... | G01R 31/001 324/457 |

FOREIGN PATENT DOCUMENTS

| | | | |
|---|---|---|---|
| CN | 101939655 B * | 9/2013 | ............ H04M 1/724 |
| WO | WO-2023245198 A2 * | 12/2023 | ......... G01R 29/0814 |

* cited by examiner

*Primary Examiner* — Carlos Garcia
(74) *Attorney, Agent, or Firm* — Hovey Williams LLP

(57) ABSTRACT

An alert device and method of detecting electrostatic discharge (ESD) events. The ESD alert device includes a substrate for supporting printed circuitry thereon, the printed circuitry, and an alert device fixed relative to the substrate. The printed circuitry may be printed onto the substrate and may include an antenna for detecting ESD as well as a signal processor communicably coupled with the antenna. The signal processor may identify that a signal received from the antenna is equal to or above a preset threshold ESD reading. The alert device may be electrically or communicably coupled to the signal processor and may be triggerable by the signal processor to provide a visual or audible alert to an operator that the preset threshold ESD reading has been reached or surpassed.

17 Claims, 3 Drawing Sheets

DEVICE AND METHOD FOR ELECTROSTATIC DISCHARGE EVENT ALERT

CROSS-REFERENCE TO RELATED APPLICATIONS

The current patent application is a non-provisional utility patent application which claims priority benefit, with regard to all common subject matter, of earlier-filed U.S. Provisional Application Ser. No. 63/610,552; titled "ADDITIVE MANUFACTURING ELECTROSTATIC DISCHARGE DETECTION DEVICE"; and filed Dec. 15, 2023. The Provisional application is hereby incorporated by reference, in its entirety, into the current patent application.

FEDERALLY SPONSORED RESEARCH AND DEVELOPMENT

This invention was made with Government support under Contract No.: DE-NA0002839 awarded by the United States Department of Energy/National Nuclear Security Administration. The Government has certain rights in the invention.

BACKGROUND OF THE INVENTION

Current electrostatic discharge (ESD) detection devices are large desktop or handheld devices and are expensive. Such prior art ESD detection devices generally monitor for ESD signals and provide a read-out of an ESD value detected. Detection of ESD events can be important when working with highly ESD sensitive devices or parts (e.g., during manufacturing or the like). Any ESD events around these sensitive devices or parts are difficult to track and can result in large amounts of scrap.

Therefore, there is a need for a device and method for ESD detection that does not suffer from these and other deficiencies of the prior art.

SUMMARY OF THE INVENTION

Embodiments of the current invention address one or more of the above-mentioned problems and provide a distinct advance in the art of ESD detection. In one embodiment, an electro-static discharge (ESD) alert device including circuitry and an alert device. Specifically, the circuitry includes an antenna for detecting ESD and a signal processor communicably coupled with the antenna. The signal processor identifies when a signal received from the antenna is equal to or above a preset threshold ESD reading. The alert device electrically or communicably coupled to the signal processor. Furthermore, the alert device alerts an operator that the preset threshold ESD reading has been reached or surpassed.

In another embodiment, an ESD alert device includes a substrate for supporting printed circuitry thereon, the printed circuitry, and an alert device fixed relative to the substrate. The printed circuitry may be printed onto the substrate and may include an antenna for detecting ESD as well as a signal processor communicably coupled with the antenna. The signal processor may identify when a signal received from the antenna is equal to or above a preset threshold ESD reading. The alert device may be electrically or communicably coupled to the signal processor and may be triggerable by the signal processor to provide a visual or audible alert to an operator that the preset threshold ESD reading has been reached or surpassed.

In yet another embodiment, a method of detecting an ESD event with a wearable ESD alert device may include the steps of receiving with an antenna printed onto a substrate of the wearable ESD alert device ESD signals and sending to at least one signal processor the ESD signals. The method may also include determining via the signal processor(s) if one or more of the ESD signals is equal to or above a preset threshold ESD reading. Finally, the method may include triggering a visual or audible alert, via an alert device fixed relative to the substrate, in response to the signal processor (s) determining that the one or more of the ESD signals are equal to or above the preset threshold ESD reading.

This summary is provided to introduce a selection of concepts in a simplified form that are further described below in the detailed description. This summary is not intended to identify key features or essential features of the claimed subject matter, nor is it intended to be used to limit the scope of the claimed subject matter. Other aspects and advantages of the current invention will be apparent from the following detailed description of the embodiments and the accompanying drawing figures.

BRIEF DESCRIPTION OF DRAWINGS

Embodiments of the current invention are described in detail below with reference to the attached drawing figures, wherein.

Figure 1:
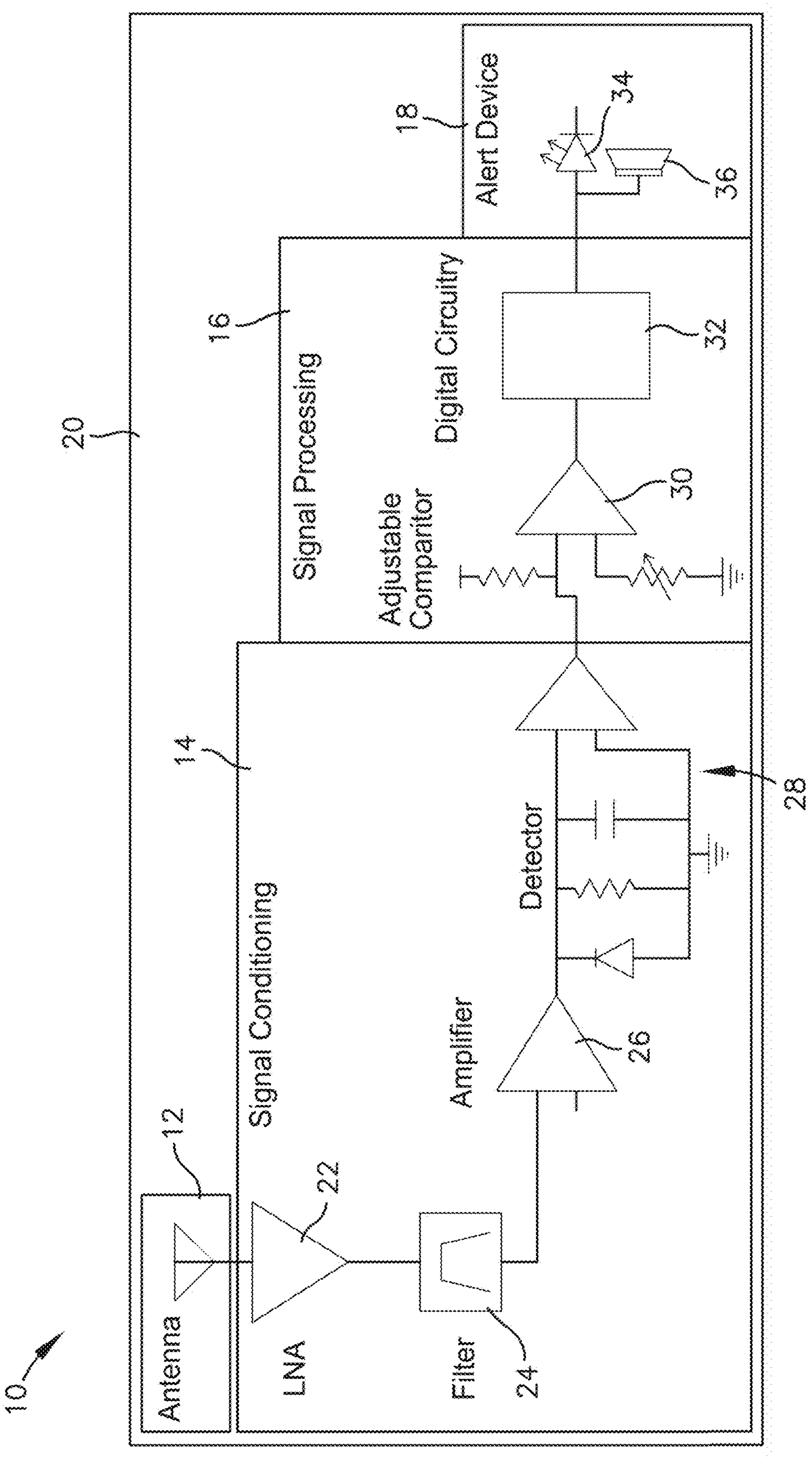
FIG. 1 is a block diagram of an electrostatic discharge (ESD) alert device, in accordance with embodiments described herein.

The drawing figures do not limit the current invention to the specific embodiments disclosed and described herein. The drawings are not necessarily to scale, emphasis instead being placed upon clearly illustrating the principles of the invention.

DETAILED DESCRIPTION OF THE INVENTION

The following detailed description of the technology references the accompanying drawings that illustrate specific embodiments in which the technology can be practiced. The embodiments are intended to describe aspects of the technology in sufficient detail to enable those skilled in the art to practice the technology. Other embodiments can be utilized and changes can be made without departing from the scope of the current invention. The following detailed description is, therefore, not to be taken in a limiting sense. The scope of the current invention is defined only by the appended claims, along with the full scope of equivalents to which such claims are entitled.

Embodiments of the present invention are generally directed to a device and methods for electrostatic discharge (ESD) detection. The ESD alert device has a small footprint and may be used for conformal, wearable, and/or planar applications, as well as incorporation into a production environment. In some embodiments, the ESD alert device is wearable, such as in ESD wardrobe. In other embodiments, an ESD alert device can be an ESD detector card that rides along with assemblies in boxes or is placed along portions of the production line. In yet another embodiment, the ESD alert device or card can be printed on an electronic assembly itself.

An example ESD alert device 10 is schematically depicted in FIG. 1. The ESD alert device 10 may contain an antenna 12, signal conditioning circuitry 14, a signal processor 16, and an alert device 18. The antennae 12 may be a small antenna that can sense an ESD event and consequently trigger the alert device 18 (e.g., an LED or buzzer device) that will alert an operator that an ESD event has been detected. The ESD alert device 10 may further include and/or be supported on a substrate 20 configured for supporting printed circuitry. For example, the substrate 20 may be plastic or some other non-conductive material and may have printed circuitry described herein etched or printed thereon. The substrate may be the size of a standard credit card or smaller. Manufacturing the ESD alert device 10 may be performed via printed electronics (via additive manufacturing or the like), providing a small footprint device at a fraction the cost of traditional ESD detection devices. Advantageously, the ESD alert device 10 may prevent a device or part that has seen an ESD event from being used in high reliability devices.

The antenna 12 may be configured to monitor for spike waves or rapid changes in voltage. The antenna 12 may be etched or printed directly onto the substrate 20 with a customized pattern, shape, and/or size via conductive traces to match specific frequency bands or radiation patterns in order to pick up ESD signals. For example, the antenna 12 may be a monopole antenna or a micro monopole antenna sensitive to high-frequency, short-duration pulses characteristic of ESD events. However, other antennas capable of detecting ESD signals may be used without departing from the scope of the disclosure herein.

In one or more embodiments, the antenna 12 may be designed for localization capabilities. For example, instead of capturing an entire room or a full distance range of the antenna 12, the antenna 12 may be selected and designed to only detect a small localized area. Additionally or alternatively, one or more of the circuitry components described herein, such as the signal conditioning circuitry 14 may process a signal received from the antenna 12 in such a way that a select localized area or select distance range is all that is processed by the ESD alert device 10. The localizing effect may advantageously allow for adjacent stations that do not set off both alarms when an ESD event only occurs in one of the two adjacent stations.

The signal conditioning circuitry 14 may condition the signal received by the antenna 12, converting that received signal into a processible value. For example, the signal conditioning circuitry 14 may include one or more resisters, capacitors, inductors, amplifiers, comparators, and/or the like. In one or more embodiments, as depicted in FIG. 1, the signal conditioning circuitry 14 may include a low noise amplifier (LNA) 22, a filter 24, an amplifier 26, and a detector 28. The LNA may, for example, amplify weak signals while introducing minimal additional noise in order to boost signal strength without degrading a signal-to-noise ratio (SNR) of the received signal. Furthermore, the filter 24 may be a band pass filter, a high pass filter, and/or a low bass filter, depending on the signal processing required for a given ESD event range of interest. The amplifier 26 may boost the signal received thereby to a desired level (e.g., a desired amplitude). Finally, the detector 28, which may also be referred to as a "peak detector," may further process the alternating current (AC) signal received thereby.

The signal processor 16 may include an adjustable comparator 30 and/or digital circuitry 32. The adjustable comparator 30 is a device that compares an input voltage to a reference voltage or a preset threshold ESD reading. The reference voltage or preset threshold can be changed or adjusted, allowing a user or designer to dynamically set the preset threshold at which the output changes state (i.e., goes high or low) depending on the application needs. In one example embodiment, the adjustable comparator 30 can output a 1 (e.g., voltage at plus side) if the preset threshold is reached and/or exceeded or a 0 (voltage at negative side) if the preset threshold is not reached. The digital circuitry 32 may be any circuitry configured to process output from the adjustable comparator 30. For example, if the adjustable comparator 30 outputs a 1, the digital circuitry 32 may be configured to respond by sending a signal to activate the alert device 18. However, other signal processors or signal processing circuits may be used without departing from the scope of the disclosure herein.

For example, in some alternative embodiments, the signal processor 16 may be and/or may comprise a processing device such as an integrated circuit or microcontroller configured for monitoring if the preset threshold is exceeded, based on the signal received from the signal conditioning circuitry 14. Furthermore, in such exemplary embodiments, the signal processor 16 may be configured to store, compute, calculate, or otherwise process and monitor the signals received from the signal conditioning device 14. However, the signal processor 16 may additionally or alternatively include one or more comparators, resistors, capacitors, and the like without departing from the scope of the disclosure herein. In some embodiments, the preset threshold may be measured in volts, and the signal processor 16 is tailored to a specific voltage depending upon the ESD requirements for a given part or assembly.

Because the signal processor 16 is only determining a simple pass/fail reading of whether or not the preset threshold was reached at any point during the manufacturing process, the device circuitry is much more simplistic than prior art ESD detection devices and can thus be smaller, which allows the device to be closer to the parts or assembly which the ESD alert device 10 is monitoring for undesirable ESD levels. The reduced cost and size of this device also allows for manufacturing to monitor ESD activity 100% of the time at multiple locations throughout the process.

The alert device 18 may be a light emitting diode (LED) 34, a speaker 36, or any alert device known in the art. Specifically, if the signal processor 16 determines that the preset threshold was exceeded, an alert signal is provided via the alert device 18 to the operator that the detected ESD event occurred. For example, the alert device 18 may include any visual alarm or audible alarm (e.g., a buzzer, an LED, or the like), which will alert an operator that an ESD event has been detected by activating the alert device 18. However, other alert techniques known in the art that can be electronically triggered may be used as the alert device 18 without departing from the scope of the invention as described herein.

Some circuitry components of the ESD detection alert 10 may be etched or printed using conductive inks like silver, copper, gold, platinum, palladium, nickel, dielectrics, or the like onto a variety of substrates (e.g., the substrate 20) or circuit board material. For example, the substrate 20 onto which the printing occurs may be a plastic card material, a conformal material, or some other materials on which printable circuits may be etched or printed. The antenna 12 and other circuitry or circuit patterns for the ESD alert device 10 may be etched or printed using printed electronics technologies to allow for circuit miniaturization, conformal surface printing, and wearable device applications, as later described herein.

Figure 2:
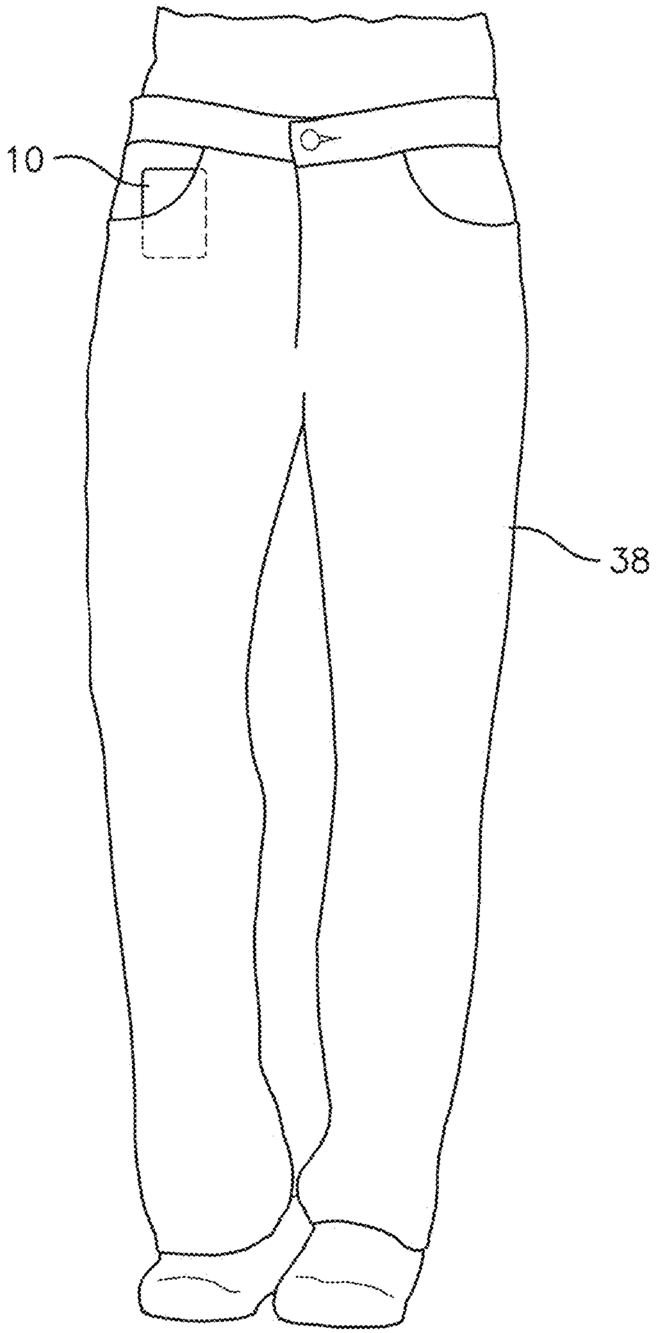
FIG. 2 is a plan view of the ESD alert device located in a pocket of a pair of pants.

As noted above, the ESD alert device 10 described herein may be incorporated into a part or assembly to monitor the part or assembly throughout a manufacturing or assembly process. Additionally or alternatively, the ESD alert device 10 may be printed to be the size of a credit or debit card (e.g., approximately 3.375 inches wide by 2.125 inches in height) to fit into an inspector or operator's pocket or may be etched onto or printed on conformal material integrated into the inspector or operator's clothing (e.g., an article of clothing or a wearable accessory). For example, wearable applications can include an ESD glove, pants 38 (as depicted in a pocket of the pants 38 in FIG. 2), or jacket with the ESD detection alert 10 integrated thereinto, or something printed in a card-like form that is small enough to be slid into pockets of clothing. The ESD alert device 10 may be printed small enough and cheaply enough that it can be tagged along with assemblies to track those assemblies or parts associated therewith all throughout the manufacturing or fabrication process of the assemblies or parts. That is, the ESD alert device 10 may be considered ride-along friendly throughout manufacturing and/or inspection processes.

In some example embodiments, the substrate 20 with the printed circuitry described herein and the alert device 18 thereon may have a thickness of less than approximately 0.25 inches (or in a range of 0.01 inches to 0.2 inches). However, the ESD alert device 10 may have a greater thickness without departing from the scope of the disclosure herein. Furthermore, the substrate 20 with the printed circuitry described herein and the alert device 18 thereon may have a width of less than approximately 3.5 inches or less than or equal to approximately 3.375 inches, as well as a height of less than approximately 3.5 inches, less than approximately 2.2 inches, or less than or equal to approximately 2.125 inches. That is, the ESD alert device 10 may have a thickness, width, and height proximate to or less than equivalent dimensions of a standard credit card. In other example embodiments, greater dimensions may be used, such as other dimensions suitable for attachment to an article of manufacture or attachment to articles of clothing or wearable accessories. Furthermore, in some embodiments, the ESD alert device 10 may be as small as physically possible using the electronics described herein when printed on any suitable substrate, even allowing for the ESD alert device 10 to be small enough to be integrated into gloves.

Figure 3:
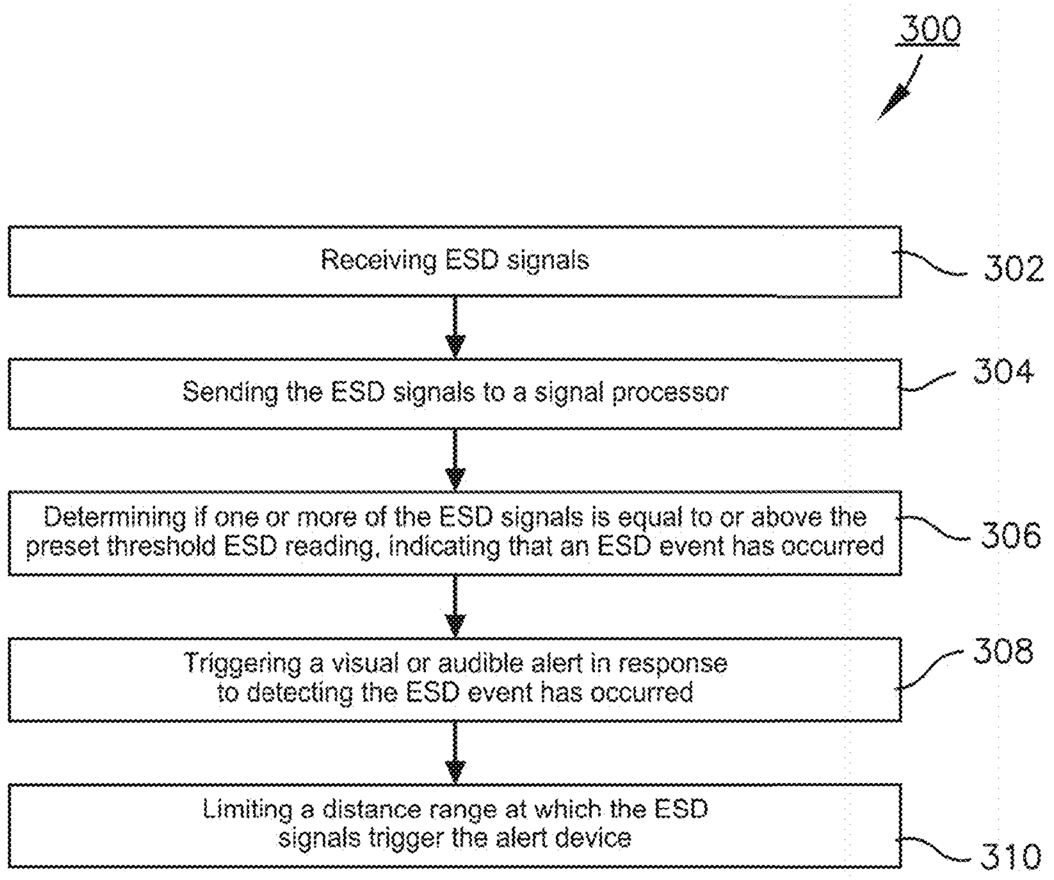
FIG. 3 is a flow chart depicting a method of using the ESD alert device in accordance with embodiments described herein.

The flow chart of FIG. 3 depicts the steps of an exemplary method 300 for detecting an ESD event with an ESD alert device. In some embodiments, various steps may be omitted, or steps may occur out of the order depicted in FIG. 3 without departing from the scope of the technology as described herein. For example, two blocks shown in succession in FIG. 3 may in fact be executed substantially concurrently, or blocks may sometimes be executed in the reverse order depending upon the functionality involved.

As depicted in FIG. 3, the method 300 may include a step of receiving ESD signals, as depicted in block 302 and sending the ESD signals to a signal processor, as depicted in block 304. Furthermore, the method 300 may include a step of determining if one or more of the ESD signals is equal to or above the preset threshold ESD reading, as depicted in block 306, thus indicating that an ESD event has occurred. The method 300 may also include triggering a visual or audible alert (e.g., via the alert device), as depicted in block 308, in response to the ESD event detected in block 306.

In some embodiments, as depicted in FIG. 3, the method 300 may also include a step of limiting a distance range at which the ESD signals trigger the alert device 18, as depicted in block 310. For example, the antenna 12 may be selected and/or designed to only detect a small localized area or distance range. Additionally or alternatively, one or more of the circuitry components described herein may process a signal received from the antenna 12 in such a way that a select localized area or select distance range is all that is processed by the ESD alert device 10, and signals outside of that distance range are excluded or otherwise filtered out. As described above, the localizing effect may advantageously allow for adjacent stations that do not set off both alarms when an ESD event only occurs in one of the two adjacent stations.

Advantageously, by making the ESD alert device 10 wearable as in some embodiments described herein, human inspection of ESD-sensitive assemblies or parts is more accurate and less prone to human error. While a human inspector is handling the assemblies or parts, there are various ESD requirements typically put in place to avoid undesirable ESD. However, if one or more of those requirements are not met, it does not always necessarily mean that an ESD event actually occurred. In prior art methods, a part or assembly could need to be scrapped merely due to the potential of an ESD event due to protocols that were not followed or other such errors, human or environmental, that are known to at least sometimes cause an ESD event. For example, if the inspector has a piece of paper too close to an assembly, it typically violates the specification for ESD event-sensitive parts. However, it is unknown if that piece of paper actually did cause an ESD event or not. Nevertheless, in some processes that assembly would be scrapped/diverted due to the unknown possible serious issue.

Conversely, the ESD alert device 10 herein, located with an assembly, with a part, and/or with a human inspector throughout the manufacturing and inspection processes, would advantageously inform the human inspector or operator if an ESD event occurred at any point during manufacturing or inspecting. This means that if no ESD event actually occurred, despite some other human error that made an ESD event possible, that part or assembly no longer needs to be scrapped. That is, the ESD alert device 10 would allow human inspectors or operators to determine that an ESD event did not happen even if some protocol was not followed exactly.

Furthermore, by having the ESD alert device 10 in the clothing of the operator, there is no extra work for an operator, who can continue with other assembly, manufacturing, or inspection duties and only notice the ESD alert device 10 if it alerts the operator that an ESD event over the preset threshold has occurred. This is advantageous, since the majority of ESD events are due to operator handling errors.

Another advantage of the ESD alert device 10 is that instead of merely being a monitoring device that gives a read-out of an ESD value detected, the ESD alert device 10 simply alerts an operator or inspector that an ESD event has occurred at or over the preset threshold. This allows for simpler circuitry in that the ESD alert device 10 merely indicates a pass or fail. This simpler circuitry saves money and also allows for a smaller device than prior art devices. Furthermore, while a standard limit may serve as a preset threshold ESD reading for the majority of electronics that could be preset in one of the ESD alert devices, some embodiments may provide an option to adjust the preset threshold of the ESD alert device 10 or an alternative one of the ESD alert device 10 may be designed and configured for lower sensitivity at a lower preset threshold ESD reading.

ADDITIONAL CONSIDERATIONS

Throughout this specification, references to "one embodiment", "an embodiment", or "embodiments" mean that the feature or features being referred to are included in at least one embodiment of the technology. Separate references to "one embodiment", "an embodiment", or "embodiments" in this description do not necessarily refer to the same embodiment and are also not mutually exclusive unless so stated and/or except as will be readily apparent to those skilled in the art from the description. For example, a feature, structure, act, etc. described in one embodiment may also be included in other embodiments, but is not necessarily included. Thus, the current invention can include a variety of combinations and/or integrations of the embodiments described herein.

Although the present application sets forth a detailed description of numerous different embodiments, it should be understood that the legal scope of the description is defined by the words of the claims set forth at the end of this patent and equivalents. The detailed description is to be construed as exemplary only and does not describe every possible embodiment since describing every possible embodiment would be impractical. Numerous alternative embodiments may be implemented, using either current technology or technology developed after the filing date of this patent, which would still fall within the scope of the claims.

Throughout this specification, plural instances may implement components, operations, or structures described as a single instance. Although individual operations of one or more methods are illustrated and described as separate operations, one or more of the individual operations may be performed concurrently, and nothing requires that the operations be performed in the order illustrated. Structures and functionality presented as separate components in example configurations may be implemented as a combined structure or component. Similarly, structures and functionality presented as a single component may be implemented as separate components. These and other variations, modifications, additions, and improvements fall within the scope of the subject matter herein.

Certain embodiments are described herein as including logic or a number of routines, subroutines, applications, or instructions. These may constitute either software (e.g., code embodied on a machine-readable medium or in a transmission signal) or hardware. In hardware, the routines, etc., are tangible units capable of performing certain operations and may be configured or arranged in a certain manner. In example embodiments, one or more computer systems (e.g., a standalone, client or server computer system) or one or more hardware modules of a computer system (e.g., a processor or a group of processors) may be configured by software (e.g., an application or application portion) as computer hardware that operates to perform certain operations as described herein.

In various embodiments, computer hardware, such as a signal processor or other such processing element, may be implemented as special purpose or as general purpose. For example, the signal processor may comprise dedicated circuitry or logic that is permanently configured, such as an application-specific integrated circuit (ASIC), or indefinitely configured, such as an FPGA, to perform certain operations. The processing element may also comprise programmable logic or circuitry (e.g., as encompassed within a general-purpose processor or other programmable processor) that is temporarily configured by software to perform certain operations. It will be appreciated that the decision to implement the processing element as special purpose, in dedicated and permanently configured circuitry, or as general purpose (e.g., configured by software) may be driven by cost and time considerations.

Accordingly, the terms "signal processor", "processing element", or equivalents should be understood to encompass a tangible entity, be that an entity that is physically constructed, permanently configured (e.g., hardwired), or temporarily configured (e.g., programmed) to operate in a certain manner or to perform certain operations described herein. Considering embodiments in which the processing element is temporarily configured (e.g., programmed), each of the processing elements need not be configured or instantiated at any one instance in time. For example, where the processing element comprises a general-purpose processor configured using software, the general-purpose processor may be configured as respective different processing elements at different times. Software may accordingly configure the processing element to constitute a particular hardware configuration at one instance of time and to constitute a different hardware configuration at a different instance of time.

Computer hardware components, such as communication elements, memory elements, processing elements, and the like, may provide information to, and receive information from, other computer hardware components. Accordingly, the described computer hardware components may be regarded as being communicatively coupled. Where multiple of such computer hardware components exist contemporaneously, communications may be achieved through signal transmission (e.g., over appropriate circuits and buses) that connect the computer hardware components. In embodiments in which multiple computer hardware components are configured or instantiated at different times, communications between such computer hardware components may be achieved, for example, through the storage and retrieval of information in memory structures to which the multiple computer hardware components have access. For example, one computer hardware component may perform an operation and store the output of that operation in a memory device to which it is communicatively coupled. A further computer hardware component may then, at a later time, access the memory device to retrieve and process the stored output. Computer hardware components may also initiate communications with input or output devices, and may operate on a resource (e.g., a collection of information).

The various operations of example methods described herein may be performed, at least partially, by one or more processing elements that are temporarily configured (e.g., by software) or permanently configured to perform the relevant operations. Whether temporarily or permanently configured, such processing elements may constitute processing element-implemented modules that operate to perform one or more operations or functions. The modules referred to herein may, in some example embodiments, comprise processing element-implemented modules.

Similarly, the methods or routines described herein may be at least partially processing element-implemented. For example, at least some of the operations of a method may be performed by one or more processing elements or processing element-implemented hardware modules. The performance of certain of the operations may be distributed among the one or more processing elements, not only residing within a single machine, but deployed across a number of machines. In some example embodiments, the processing elements may be located in a single location (e.g., within a home environment, an office environment or as a server farm), while in other embodiments the processing elements may be distributed across a number of locations.

Unless specifically stated otherwise, discussions herein using words such as "processing," "computing," "calculating," "determining," "presenting," "displaying," or the like may refer to actions or processes of a machine (e.g., a computer with a processing element and other computer hardware components) that manipulates or transforms data represented as physical (e.g., electronic, magnetic, or optical) quantities within one or more memories (e.g., volatile memory, non-volatile memory, or a combination thereof), registers, or other machine components that receive, store, transmit, or display information.

As used herein, the terms "comprises," "comprising," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus.

The patent claims at the end of this patent application are not intended to be construed under 35 U.S.C. § 112(f) unless traditional means-plus-function language is expressly recited, such as "means for" or "step for" language being explicitly recited in the claim(s).

Although the technology has been described with reference to the embodiments illustrated in the attached drawing figures, it is noted that equivalents may be employed and substitutions made herein without departing from the scope of the technology as recited in the claims.

Having thus described various embodiments of the technology, what is claimed as new and desired to be protected by Letters Patent includes the following:

1. An electro-static discharge (ESD) alert device comprising:
- circuitry including:
  - an antenna configured for detecting ESD, and
  - a signal processor communicably coupled with the antenna and configured to identify when a signal received from the antenna is equal to or above a preset threshold ESD reading, wherein the signal processor includes an adjustable comparator, wherein the adjustable comparator has an adjustable reference voltage, and the adjustable comparator is configured such that adjustment of the reference voltage adjusts the preset threshold ESD reading; and
- an alert device electrically or communicably coupled to the signal processor, wherein the alert device is configured to alert an operator that the preset threshold ESD reading has been reached or surpassed.

2. The ESD alert device of claim 1, further comprising a substrate supporting the circuitry and the alert device, wherein the substrate has a thickness of less than approximately 0.25 inches, a width of less than approximately 3.5 inches, and a length of less than approximately 3.5 inches.

3. The ESD alert device of claim 2, wherein the dimensions of the ESD alert device include a width and a length approximately the size of a credit card or smaller.

4. The ESD alert device of claim 1, further comprising a substrate supporting the circuitry and the alert device and an article of clothing or a wearable accessory, wherein the substrate is integrated into the article of clothing or the wearable accessory.

5. The ESD alert device of claim 1, wherein the alert device is configured to provide a visual or audible alert when the preset threshold ESD reading has been reached or surpassed.

6. The ESD alert device of claim 1, further comprising a substrate supporting the circuitry and the alert device, wherein the antenna and the signal processor are etched onto the substrate or printed onto the substrate via additive manufacturing.

7. The ESD alert device of claim 1, further comprising signal conditioning circuitry between the antenna and the signal processor.

8. The ESD alert device of claim 7, wherein the signal conditioning circuitry includes at least one of an amplifier, a filter, and a detector.

9. The ESD alert device of claim 1, wherein one or more elements of the circuitry are configured to limit a distance range at which ESD detection above the preset threshold ESD reading triggers the alert device.

10. An electro-static discharge (ESD) alert device comprising:
- a substrate for supporting printed circuitry;
- the printed circuitry etched or printed onto the substrate, the printed circuitry including an antenna printed and configured for detecting ESD and a signal processor communicably coupled with the antenna and configured to identify when a signal received from the antenna is equal to or above a preset threshold ESD reading, wherein the signal processor includes an adjustable comparator having an adjustable reference voltage, and the adjustable comparator is configured such that adjustment of the reference voltage adjusts the preset threshold ESD reading; and
- an alert device fixed relative to the substrate and electrically or communicably coupled to the signal processor, wherein the alert device is triggerable by the signal processor to provide a visual or audible alert to an operator that the preset threshold ESD reading has been reached or surpassed.

11. The ESD alert device of claim 10, wherein the dimensions of the ESD alert device have a width and a length approximately the size of a credit card or smaller.

12. The ESD alert device of claim 10, further comprising an article of clothing or wearable accessory, wherein the substrate is integrated into the article of clothing or wearable accessory.

13. The ESD alert device of claim 10, wherein one or more elements of the printed circuitry are configured to limit a distance range at which ESD detection above the preset threshold ESD reading triggers the alert device.

14. The ESD alert device of claim 10, further comprising signal conditioning circuitry between the antenna and the signal processor.

15. A method of detecting an electro-static discharge (ESD) event with a wearable ESD alert device, the method comprising:
- receiving with an antenna printed onto a substrate of the wearable ESD alert device ESD signals;
- sending to at least one signal processor the ESD signals;
- determining via the at least one signal processor if one or more of the ESD signals is equal to or above a preset threshold ESD reading;
- limiting a distance range at which the ESD signals trigger an alert device; and triggering a visual or audible alert, via the alert device fixed relative to the substrate, in response to the at least one signal processor determining that the one or more of the ESD signals are equal to or above the preset threshold ESD reading.

16. The method of claim 15, wherein the substrate is integrated into an article of clothing or a wearable accessory.

17. The method of claim 15, wherein the step of limiting the distance range comprises processing the ESD signals received from the antenna such that any of the ESD signals outside of a select localized area or select distance range are excluded or filtered out.

* * * * *